United States Patent
Li et al.

(10) Patent No.: US 9,961,174 B2
(45) Date of Patent: May 1, 2018

(54) ANALOG BEHAVIOR MODELING FOR 3-PHASE SIGNALING

(71) Applicant: QUALCOMM Incorporated, San Diego, CA (US)

(72) Inventors: Xiang Li, San Diego, CA (US); Nakul Midha, San Diego, CA (US); Varun Radhakrishnan, San Diego, CA (US); Chulkyu Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 840 days.

(21) Appl. No.: 14/156,329

(22) Filed: Jan. 15, 2014

(65) Prior Publication Data

US 2015/0201052 A1   Jul. 16, 2015

(51) Int. Cl.
| | |
|---|---|
| *H04M 17/00* | (2006.01) |
| *H04M 1/02* | (2006.01) |
| *H04B 17/00* | (2015.01) |
| *H04L 25/02* | (2006.01) |
| *H04L 25/49* | (2006.01) |
| *G01R 31/28* | (2006.01) |

(52) U.S. Cl.
CPC .......... *H04M 1/0266* (2013.01); *H04B 17/00* (2013.01); *H04L 25/0272* (2013.01); *H04L 25/4917* (2013.01); *G01R 31/2848* (2013.01)

(58) Field of Classification Search
CPC ............. H04M 1/0266; H04L 25/0272; H04L 25/4917; H04B 17/00; G01R 31/2848
See application file for complete search history.

(56) References Cited

U.S. PATENT DOCUMENTS

| | | | |
|---|---|---|---|
| 6,002,861 A | 12/1999 | Butts et al. | |
| 6,675,328 B1 * | 1/2004 | Krishnamachari | H04L 1/205 714/704 |
| 6,725,404 B1 * | 4/2004 | Choudhury | G01R 31/045 714/715 |

(Continued)

FOREIGN PATENT DOCUMENTS

| | | |
|---|---|---|
| CN | 202403774 U | 8/2012 |
| WO | WO-2010056346 A2 | 5/2010 |

OTHER PUBLICATIONS

International Search Report and Written Opinion—PCT/US2015/011142—ISA/EPO—dated May 7, 2015.

(Continued)

*Primary Examiner* — Dwin M Craig
*Assistant Examiner* — Steven W Crabb
(74) *Attorney, Agent, or Firm* — Loza & Loza LLP

(57) ABSTRACT

System, methods and apparatus are described that model analog behavior in a multi-wire, multi-phase communications link. A digital signal representative of a physical connection in a communications link and a virtual signal characterizing a three-phase signal transmitted over the physical connection are generated. The virtual signal may be configured to model one or more analog characteristics of the physical connection. The analog characteristics may include voltage states defining the three-phase signal. The analog characteristics of the physical connection include at least three voltage states corresponding to signaling states of the three-phase signal.

48 Claims, 11 Drawing Sheets

(56) References Cited

U.S. PATENT DOCUMENTS

| | | | | |
|---|---|---|---|---|
| 6,760,882 | B1* | 7/2004 | Gesbert | H04L 1/0016 370/252 |
| 7,145,411 | B1* | 12/2006 | Blair | H01P 3/006 333/247 |
| 8,996,740 | B2* | 3/2015 | Wiley | H04L 25/02 375/259 |
| 9,317,353 | B2* | 4/2016 | Ravi | G06F 11/076 |
| 2007/0099586 | A1* | 5/2007 | Kerth | H04M 1/24 455/131 |
| 2007/0129926 | A1 | 6/2007 | Verheyen et al. | |
| 2007/0189675 | A1* | 8/2007 | Nagatsuka | G01R 31/42 385/88 |
| 2008/0291063 | A1* | 11/2008 | Hollis | H03M 5/16 341/55 |
| 2010/0013498 | A1* | 1/2010 | Olguin | G01R 27/16 324/649 |
| 2011/0110412 | A1* | 5/2011 | Shin | H04L 25/0272 375/224 |
| 2012/0191440 | A1 | 7/2012 | Meagher et al. | |
| 2013/0241759 | A1* | 9/2013 | Wiley | G08C 19/16 341/173 |
| 2014/0003543 | A1 | 1/2014 | Wiley et al. | |

OTHER PUBLICATIONS

National Instruments, "Complete System Simulation of a 3-Phase Inverter Using NI Multisim and LabVIEW," Feb. 6, 2012, Retrieved from the Internet < URL: http://www.ni.com/white-paper/13720/en/ >, 6 pages.

\* cited by examiner

ANALOG BEHAVIOR MODELING FOR 3-PHASE SIGNALING

BACKGROUND

Field

The present disclosure relates generally to high-speed data communications interfaces, and more particularly, modeling of signaling in multi-wire, multi-phase data communication links.

Background

Manufacturers of mobile devices, such as cellular phones, may obtain components of the mobile devices from various sources, including different manufacturers. For example, an application processor in a cellular phone may be obtained from a first manufacturer, while the display for the cellular phone may be obtained from a second manufacturer. The application processor and a display or other device may be interconnected using a standards-based or proprietary physical interface. For example, a display may provide an interface that conforms to the Display System Interface (DSI) standard specified by the Mobile Industry Processor Interface Alliance (MIPI).

Simulation of signaling in a multi-phase can be problematic. In particular, certain behaviors of the multi-phase signal are related to the analog characteristics of the physical signal on a wire or other connector. The use of real numbers to represent the analog state of the wire can result in the generation of large amounts of data to represent a signal on a wire, with a resultant excessive processing overhead to perform calculations using real number representations of voltage states.

SUMMARY

Embodiments disclosed herein provide systems, methods and apparatus that enable improved analog behavior modeling for a multi-wire and/or multiphase communications link. Certain aspects described herein may find application in digital simulation and analog simulation.

In an aspect of the disclosure, a method for simulating digital systems includes generating a digital signal representative of a physical connection in a communications link, generating a virtual signal characterizing a three-phase signal transmitted over the physical connection, and configuring the virtual signal to model one or more analog characteristics of the physical connection. The analog characteristics may include voltage states defining the three-phase signal. The analog characteristics of the physical connection may include at least three voltage states corresponding to signaling states of the three-phase signal.

In an aspect of the disclosure, the voltage states include at least three valid voltage states, each voltage state corresponding to a voltage level associated with the physical connection. One of the at least three valid voltage states includes an undriven state. Only one physical connection in the communications link is in the undriven state when the communications link is in an active mode of operation. The virtual signal may select between one or more modes of operation of the physical connection. The physical connection may be in a high-impedance state or an undefined state when an inactive mode of operation is selected. The one or more modes of operation include a high-speed mode and a low-speed mode.

In an aspect of the disclosure, the digital signal includes a first binary bit that selects between a first voltage state and a second voltage state. A voltage level of the second voltage state may be selected by the virtual signal. In one example, the communications link includes three physical connections, each physical connection communicating a different phase of the three-phase signal when an active mode of operation is selected. Each of the three physical connections may be in the high-impedance state in the inactive mode of operation.

In an aspect of the disclosure, the three-phase signal switches within a voltage range bounded by a maximum voltage level and a minimum voltage level. The first voltage state may be defined as the minimum voltage level. The voltage level of the second voltage state may be selected by the virtual signal as either the maximum voltage level or an intermediate voltage level that is greater than the minimum voltage level and less than the maximum voltage level.

In an aspect of the disclosure, the three-phase signal switches within a voltage range bounded by a maximum voltage level and a minimum voltage level. The first voltage state may be defined as the maximum voltage level. The voltage level of the second voltage state may be selected by the virtual signal as either the minimum voltage level or an intermediate voltage level that is greater than the minimum voltage level and less than the maximum voltage level.

In an aspect of the disclosure, the virtual signal characterizes analog behaviors of the physical connection when the communications link is operated in a high-speed mode that are different analog behaviors of the physical connection when the communications link is operated in a low-speed modes of operation. The analog behaviors of the physical connection may include a rise time or a rate of rise time between signal states on the physical connection.

In an aspect of the disclosure, an apparatus includes means for generating a digital signal representative of a physical connection in a communications link, means for generating a virtual signal characterizing a three-phase signal transmitted over the physical connection, and means for configuring the virtual signal to model one or more analog characteristics of the physical connection. The analog characteristics including voltage states may define the three-phase signal. The analog characteristics of the physical connection may include at least three voltage states corresponding to signaling states of the three-phase signal.

In an aspect of the disclosure, an apparatus includes at least one processing circuit configured to generate a digital signal representative of a physical connection in a communications link and a virtual signal characterizing a three-phase signal transmitted over the physical connection. The virtual signal may represent one or more analog characteristics of the physical connection. The analog characteristics may include voltage states defining the three-phase signal.

In an aspect of the disclosure, an apparatus for simulating digital systems includes at least one processing circuit and a processor-readable storage medium in electronic communication with the processor. The processor-readable storage medium may maintain or store one or more instructions. The instructions, when executed by a processing circuit may cause the processing circuit to generate a digital signal representative of a physical connection in a communications link, generate a virtual signal characterizing a three-phase signal transmitted over the physical connection, and configure the virtual signal to model one or more analog characteristics of the physical connection. The analog characteristics may include voltage states defining the three-phase signal. The analog characteristics of the physical connection may include at least three voltage states corresponding to signaling states of the three-phase signal.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Figure 1:
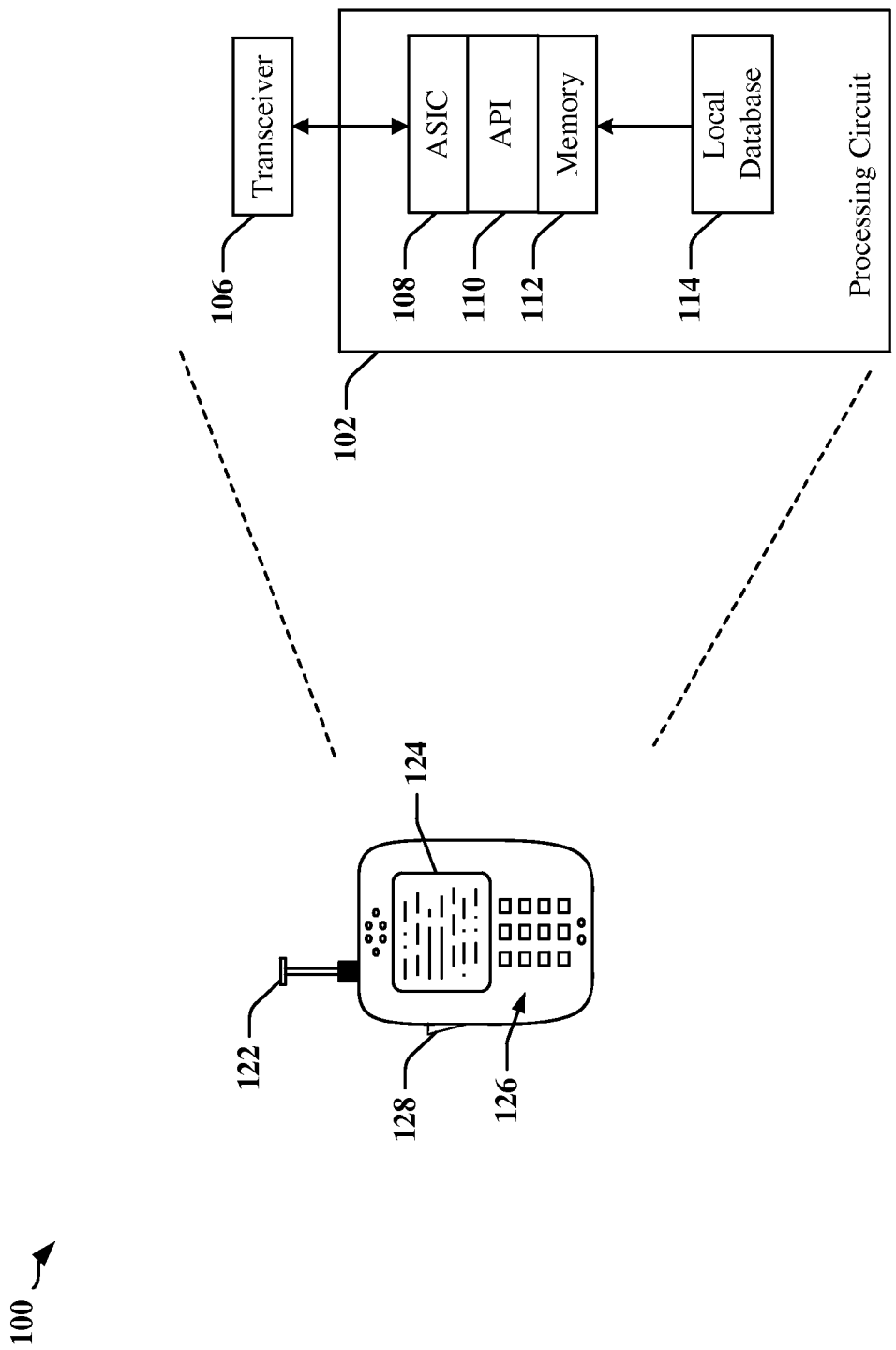
FIG. 1 depicts an apparatus employing a data link between integrated circuit (IC) devices that selectively operates according to one of plurality of available standards.

Certain aspects of the invention may be applicable to communications links deployed between electronic devices that may include subcomponents of an apparatus such as a telephone, a mobile computing device, an appliance, automobile electronics, avionics systems, etc. FIG. 1 depicts an apparatus that may employ a communication link between IC devices. In one example, apparatus 100 may include a wireless communication device that communicates through an RF transceiver with a radio access network (RAN), a core access network, the Internet and/or another network. Apparatus 100 may include a communications transceiver 106 operably coupled to processing circuit 102. Processing circuit 102 may include one or more IC devices, such as an application-specific IC (ASIC) 108. ASIC 108 may include one or more processing devices, logic circuits, and so on. Processing circuit 102 may include and/or be coupled to processor readable storage such as a memory 112 that may maintain instructions and data the may be executed by processing circuit 102. Processing circuit 102 may be controlled by one or more of an operating system and an application programming interface (API) 110 layer that supports and enables execution of software modules residing in storage media, such as memory device 112 of the wireless device. Memory device 112 may include read-only memory (ROM) or random-access memory (RAM), electrically erasable programmable ROM (EEPROM), flash cards, or any memory device that can be used in processing systems and computing platforms. Processing circuit 102 may include or access a local database 114 that can maintain operational parameters and other information used to configure and operate apparatus 100. Local database 114 may be implemented using one or more of a database module, flash memory, magnetic media, EEPROM, optical media, tape, soft or hard disk, or the like. The processing circuit may also be operably coupled to external devices such as antenna 122, display 124, operator controls, such as button 128 and keypad 126 among other components.

Figure 2:
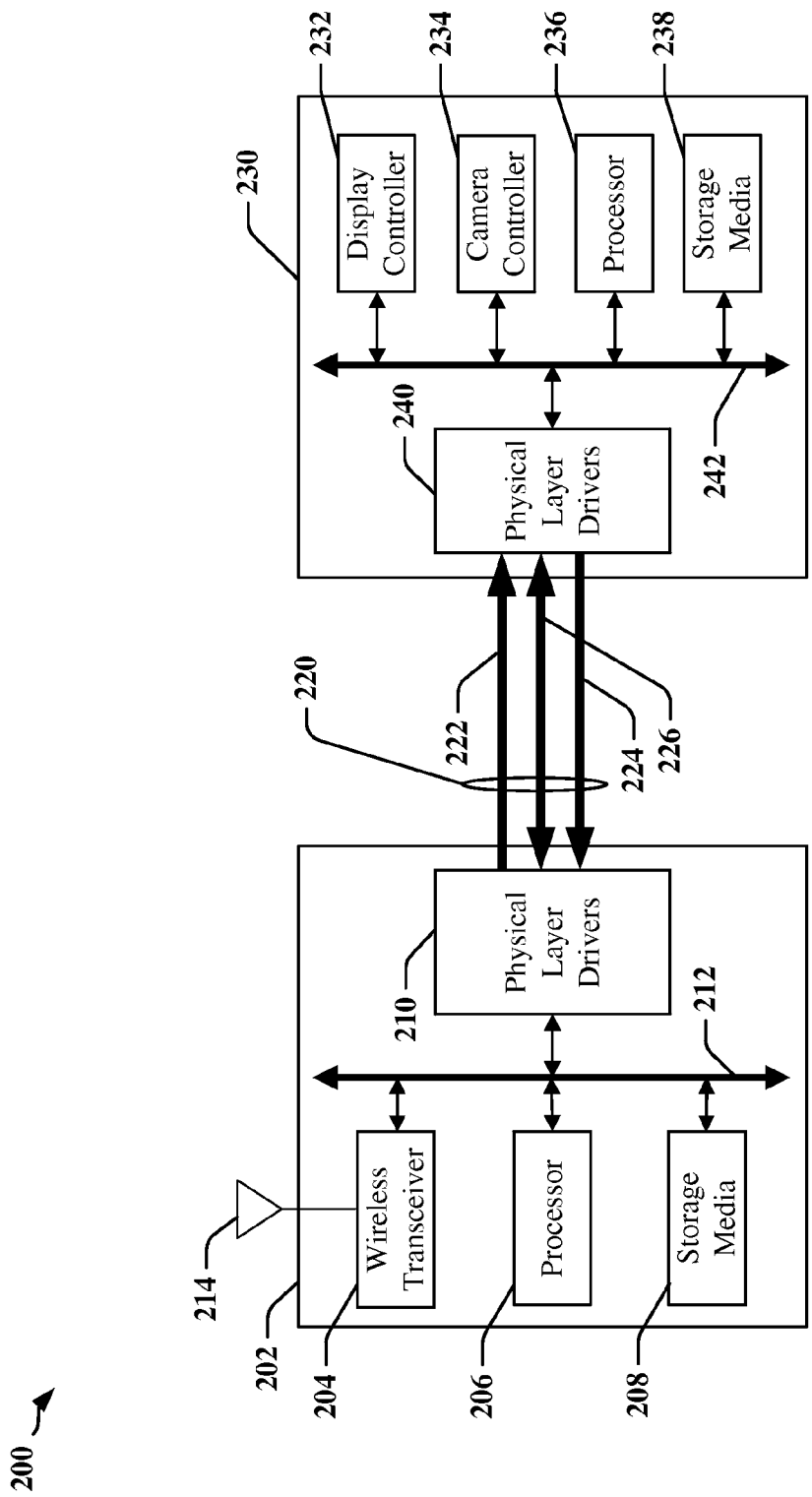
FIG. 2 illustrates a system architecture for an apparatus employing a data link between IC devices that selectively operates according to one of plurality of available standards.

FIG. 2 is a block schematic 200 illustrating certain aspects of an apparatus such as a wireless mobile device, a mobile telephone, a mobile computing system, a wireless telephone, a notebook computer, a tablet computing device, a media player, a gaming device, or the like. Apparatus 200 may include a plurality of IC devices 202 and 230 that exchange data and control information through a communication link 220. The communication link 220 may be used to connect a pair of IC devices 202 and 230 that are located in close proximity to one another, or that are physically located in different parts of the apparatus 200. In one example, the communication link 220 may be provided on a chip carrier, substrate or circuit board that carries the IC devices 202 and 230. In another example, a first IC device 202 may be located in a keypad section of a flip-phone while a second IC device 230 may be located in a display section of the flip-phone. In another example, a portion of the communication link 220 may include a cable or optical connection.

The communication link 220 may include multiple channels 222, 224 and 226. One or more channel 226 may be bidirectional, and may operate in half-duplex and/or full-duplex modes. One or more channel 222 and 224 may be unidirectional. The communication link 220 may be asymmetrical, providing higher bandwidth in one direction. In one example described herein, a first communications channel 222 may be referred to as a forward link 222 while a second communications channel 224 may be referred to as a reverse link 224. The first IC device 202 may be designated as a host system or transmitter, while the second IC device 230 may be designated as a client system or receiver, even if both IC devices 202 and 230 are configured to transmit and receive on the communications link 222. In one example, the forward link 222 may operate at a higher data rate when communicating data from a first IC device 202 to a second IC device 230, while the reverse link 224 may operate at a lower data rate when communicating data from the second IC device 230 to the first IC device 202.

The IC devices 202 and 230 may each include a processor or other processing and/or computing circuit or device 206, 236. In one example, the first IC device 202 may perform core functions of the apparatus 200, including maintaining wireless communications through a wireless transceiver 204 and an antenna 214, while the second IC device 230 may support a user interface that manages or operates a display controller 232, and may control operations of a camera or video input device using a camera controller 234. Other features supported by one or more of the IC devices 202 and 230 may include a keyboard, a voice-recognition component, and other input or output devices. Display controller 232 may include circuits and software drivers that support displays such as a liquid crystal display (LCD) panel, touch-screen display, indicators and so on. Storage media 208 and 238 may include transitory and/or non-transitory storage devices adapted to maintain instructions and data used by respective processors 206 and 236, and/or other components of the IC devices 202 and 230. Communication between each processor 206, 236 and its corresponding storage media 208 and 238 and other modules and circuits may be facilitated by one or more bus 212 and 242, respectively.

Reverse link 224 may be operated in the same manner as the forward link 222, and the forward link 222, and reverse link 224 may be capable of transmitting at comparable speeds or at different speeds, where speed may be expressed as data transfer rate and/or clocking rates. The forward and reverse data rates may be substantially the same or differ by orders of magnitude, depending on the application. In some applications, a single bidirectional link 226 may support communications between the first IC device 202 and the second IC device 230. The forward link 222 and/or reverse link 224 may be configurable to operate in a bidirectional mode when, for example, the forward and reverse links 222 and 224 share the same physical connections and operate in a half-duplex manner. In one example, the communication link 220 may be operated to communicate control, command and other information between the first IC device 202 and the second IC device 230 in accordance with an industry or other standard.

Industry standards may be application specific. In one example, the MIPI standard defines physical layer interfaces including a synchronous interface specification (D-PHY) between an application processor IC device 202 and an IC device 230 that supports the camera or display in a mobile device. The D-PHY specification governs the operational characteristics of products that comply with MIPI specifications for mobile devices. A D-PHY interface may support data transfers using a flexible, low-cost, high-speed serial interface that interconnects between components 202 and 230 within a mobile device. These interfaces may include complimentary metal-oxide-semiconductor (CMOS) parallel busses providing relatively low bit rates with slow edges to avoid electromagnetic interference (EMI) issues.

The communication link 220 of FIG. 2 may be implemented as a wired bus that includes a plurality of signal wires (denoted as M wires). The M wires may be configured to carry N-phase encoded data in a high-speed digital interface, such as a mobile display digital interface (MDDI). The M wires may facilitate N-phase polarity encoding on one or more of the channels 222, 224 and 226. The physical layer drivers 210 and 240 may be configured or adapted to generate N-phase polarity encoded data for transmission on the communication link 220. The use of N-phase polarity encoding provides high speed data transfer and may consume half or less of the power of other interfaces because fewer drivers are active in N-phase polarity encoded data links 220.

N-phase polarity encoding devices 210 and/or 240 can typically encode multiple bits per transition on the communication link 220. In one example, a combination of 3-phase encoding and polarity encoding may be used to support a wide video graphics array (WVGA) 80 frames per second LCD driver IC without a frame buffer, delivering pixel data at 810 Mbps for display refresh.

Figure 3:
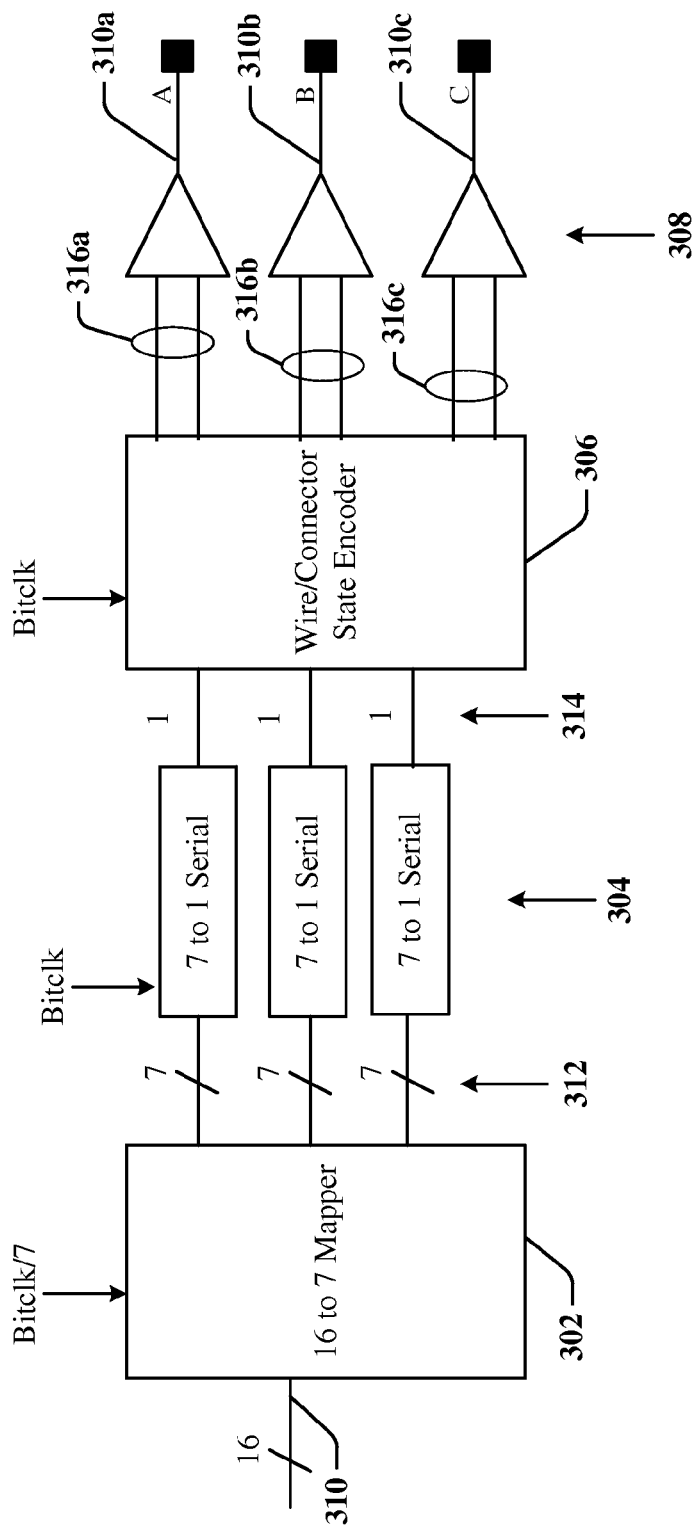
FIG. 3 illustrates an N-phase polarity data encoder.

FIG. 3 is a schematic diagram 300 illustrating an M-wire, N-phase polarity encoder that may be used to implement certain aspects of the communication link 220 depicted in FIG. 2. In the example depicted, the M-wire, N-phase polarity encoder transmitter is configured to transmit information using M=3 wire and N=3 phase signaling. The example of 3-wire, 3-phase encoding is selected solely for the purpose of simplifying descriptions of certain aspects of the invention. The principles and techniques disclosed for 3-wire, 3-phase encoders can be applied in other configurations of M-wire, N-phase polarity encoders.

Signaling states defined for each of the M wires in an M-wire, N-phase polarity encoding scheme may include a positively driven state, a negatively driven state and an undriven state. In the 3-wire, 3-phase polarity encoding scheme, the positively driven state and the negatively driven state may be obtained by providing a voltage differential between two of the signal wires 310a, 310b and/or 310c, and/or by driving a current through two of the signal wires 310a, 310b and/or 310c connected in series such that the current flows in different directions in the two signal wires 310a, 310b and/or 310c. Typically, there is no significant current flow through an undriven signal wire 310a, 310b or 310c. Signaling states defined for a 3-wire, 3-phase polarity encoding scheme may be denoted using the three voltage or current states (+1, −1, and 0).

An undriven state (i.e., the 0 state) may be obtained on a signal wire 310a, 310b or 310c by passively or actively causing an "undriven" signal wire 310a, 310b or 310c to assume a voltage level that lies substantially halfway between positive and negative voltage levels provided on driven signal wires 310a, 310b and/or 310c. In one example, the undriven state may be realized by placing an output of a driver of a signal wire 310a, 310b or 310c in a high-impedance mode. The three-phase 0 state, the undriven state, and a high-impedance state may be electrically equivalent in a 3-phase signaling scheme from the perspective of a single signal wire 310a, 310b or 310c. However, only one of the signal wires 310a, 310b, 310c can be in the undriven state in a symbol. Accordingly, a symbol may be considered to be an error symbol if two of the three signal wires 310a, 310b, 310c are in high-impedance state. If all three signal wires 310a, 310b, 310c are in high-impedance state, the communication link 220 may be considered inactive.

A 3-wire, 3-phase polarity encoder may employ drivers 308 to control the signaling state of connectors 310*a*, 310*b* and 310*c*. The drivers 308 may be implemented as unit-level current-mode or voltage-mode drivers. In one example, each driver 308 may receive sets of two or more signals 316*a*, 316*b* and 316*c* that determine the output state of corresponding connectors 310*a*, 310*b* and 310*c*. When each of the sets of signals 316*a*, 316*b* and 316*c* include a pair of signals, four states may be defined for the corresponding connectors 310*a*, 310*b* and 310*c*. When each of the sets of signals 316*a*, 316*b* and 316*c* include three signals, 8 states may be defined for corresponding connectors 310*a*, 310*b* and 310*c*.

For each transmitted symbol interval in an M-wire, N-phase polarity encoding scheme, at least one signal wire 310*a*, 310*b* or 310*c* is in the undriven (0) voltage or current state, while the number of positively driven (+1 voltage or current state) signal wires 310*a*, 310*b* or 310*c* is equal to the number of negatively driven (−1 voltage or current state) signal wires 310*a*, 310*b* or 310*c*, such that the sum of current flowing to the receiver is always zero. For each symbol, the state of at least one signal wire 310*a*, 310*b* or 310*c* is changed from the symbol transmitted in the preceding transmission interval.

In operation, a mapper 302 may receive and map 16 bit data 310 to 7 symbols 312. In the 3-wire example, each of the 7 symbols defines the states of the signal wires 310*a*, 310*b* and 310*c* for one symbol interval. The 7 symbols 312 may be serialized using parallel-to-serial converters 304 that provide a timed sequence of states 314 for each wire 310*a*, 310*b* and 310*c*. The sequence of states 314 is typically timed using a transmission clock. An M-wire phase encoder 306 receives the sequence of 7 symbols 312 produced by the mapper one symbol at a time and computes the state of each signal wire 310*a*, 310*b* and 310*c* for each symbol interval. The 3-wire encoder 306 selects the states of the signal wires 310*a*, 310*b* and 310*c* based on the current input symbol of the 7 symbols 314 and the previous states of signal wires 310*a*, 310*b* and 310*c*.

The use of M-wire, N-phase encoding permits a number of bits to be encoded in a plurality of symbols where the bits per symbol is not an integer. In the simple example of a 3-wire communications link, there are 3 available combinations of 2 wires, which may be driven simultaneously, and 2 possible combinations of polarity on the pair of wires that is driven, yielding 6 possible states. Since each transition occurs from a current state, 5 of the 6 states are available at every transition. The state of at least one wire is required to change at each transition. With 5 states, $\log_2(5) \cong 2.32$ bits may be encoded per symbol. Accordingly, a mapper may accept a 16-bit word and convert it to 7 symbols because 7 symbols carrying 2.32 bits per symbol can encode 16.24 bits. In other words, a combination of seven symbols that encode five states has $5^7$ (78,125) permutations. Accordingly, the 7 symbols may be used to encode the $2^{16}$ (65,536) permutations of 16 bits.

Figure 4:
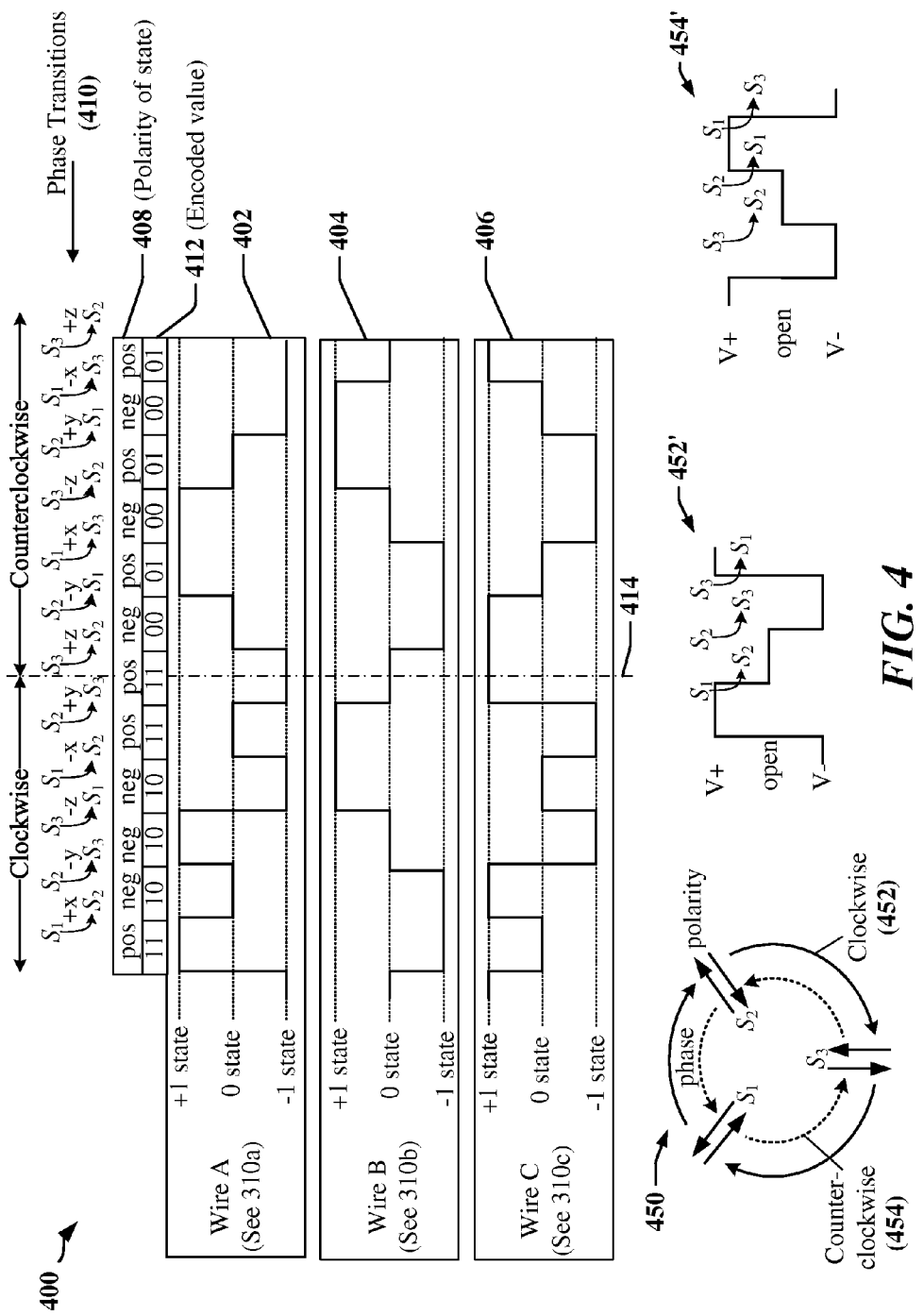
FIG. 4 illustrates signaling in an N-phase polarity encoded interface.

FIG. 4 includes an example of a timing chart 400 for signals encoded using a three-phase modulation data-encoding scheme, which is based on the circular state diagram 450. Information may be encoded in a sequence of signaling states where, for example, a wire or connector is in one of three phase states $S_1$, $S_2$ and $S_3$ defined by the state diagram 450. Each state may be separated from the other states by a 120° phase shift. In one example, data may be encoded in the direction of rotation of phase states on the wire or connector. The phase states in a signal may rotate in clockwise direction 452 and 452' or counterclockwise direction 454 and 454'. In the clockwise direction 452 and 454' for example, the phase states may advance in a sequence that includes one or more of the transitions from $S_1$ to $S_2$, from $S_2$ to $S_3$ and from $S_3$ to $S_1$. In the counterclockwise direction 454 and 454', the phase states may advance in a sequence that includes one or more of the transitions from $S_1$ to $S_3$, from $S_3$ to $S_2$ and from $S_2$ to $S_1$. The three wires 310*a*, 310*b* and 310*c* carry different versions of the same signal, where the versions are phase shifted by 120° with respect to one another. Each signaling state may be represented as a different voltage level on a wire or connector and/or a direction of current flow through the wire or connector. During each of the sequence of signaling states in a 3-wire system, each wire 310*a*, 310*b* and 310*c* is in a different signaling state than the other wires. When more than 3 wires 310*a*, 310*b* and 310*c* are used in a 3-phase encoding system, two or more wires 310*a*, 310*b* and/or 310*c* can be in the same signaling state at each signaling interval, although each state is present on at least one wire 310*a*, 310*b* and/or 310*c* in every signaling interval.

Information may be encoded in the direction of rotation at each phase transition 410, and the 3-phase signal may change direction for each signaling state. Direction of rotation may be determined by considering which wires 310*a*, 310*b* and/or 310*c* are in the '0' state before and after a phase transition, because the undriven wire 310*a*, 310*b* and/or 310*c* changes at every signaling state in a rotating three-phase signal, regardless of the direction of rotation.

The encoding scheme may also encode information in the polarity 408 of the two of the conductors 310*a*, 310*b* and 310*c* that are actively driven. At any time in a 3-wire implementation, exactly two of the conductors 310*a*, 310*b*, 310*c* are driven with currents in opposite directions and/or with a voltage differential. In a simple implementation, data 412 may be encoded using two bit values 412, where one bit is encoded in the direction of phase transitions 410 and the second bit is encoded in the polarity for the current state 408.

The timing chart 400 illustrates data encoding using both phase rotation direction and polarity. The curves 402, 404 and 406 relate to signals carried on three wires 310*a*, 310*b* and 310*c*, respectively for multiple phase states. Initially, the phase transitions 410 are in a clockwise direction and the most significant bit is set to binary '1,' until the rotation of phase transitions 410 switches at a time 414 to a counterclockwise direction, as represented by a binary '0' of the most significant bit. The least significant bit reflects the polarity 408 of the signal in each state.

According to certain aspects disclosed herein, one bit of data may be encoded in the rotation, or phase change in a 3-wire, 3-phase encoding system, and an additional bit may be encoded in the polarity of the two driven wires. Additional information may be encoded in each transition of a 3-wire, 3-phase encoding system by allowing transition to any of the possible states from a current state. Given 3 rotational phases and two polarities for each phase, 6 states are available in a 3-wire, 3-phase encoding system. Accordingly, 5 states are available from any current state. Accordingly, there may be $\log_2(5) \cong 2.32$ bits encoded per symbol (transition), which allows the mapper 302 to accept a 16-bit word and encode it in 7 symbols.

N-Phase data transfer may use more than three wires provided in a communication medium, such as a bus. The use of additional signal wires that can be driven simultaneously provides more combinations of states and polarities and allows more bits of data to be encoded at each transition between states. This can significantly improve throughput of the system, and reduce the power consumption over approaches that use multiple differential pairs to transmit data bits, while providing increased bandwidth.

In one example, an encoder may transmit symbols using 6 wires with 2 pairs of wires driven for each state. The 6 wires may be labeled A through F, such that in one state, wires A and F are driven positive, wires B and E negative, and C and D are undriven (or carry no current). For six wires, there may be:

$$C(6, 4) = \frac{6!}{(6-4)! \cdot 4!} = 15$$

possible combinations of actively driven wires, with:

$$C(4, 2) = \frac{4!}{(4-2)! \cdot 2!} = 6$$

different combinations of polarity for each phase state.

The 15 different combinations of actively driven wires may include:

| A B C D | A B C E | A B C F | A B D E | A B D F |
| A B E F | A C D E | A C D F | A C E F | A D E F |
| B C D E | B C D F | B C E F | B D E F | C D E F |

Of the 4 wires driven, the possible combinations of two wires driven positive (and the other two must be negative). The combinations of polarity may include:

| + + − − | + − − + | + − + − | − + − + | − + + − | − − + + |

Accordingly, the total number of different states may be calculated as 15×6=90. To guarantee a transition between symbols, 89 states are available from any current state, and the number of bits that may be encoded in each symbol may be calculated as: $\log_2(89) \cong 6.47$ bits per symbol. In this example, a 32-bit word can be encoded by the mapper into 5 symbols, given that 5×6.47=32.35 bits.

The general equation for the number of combinations of wires that can be driven for a bus of any size, as a function of the number of wires in the bus and number of wires simultaneously driven:

$$C(N_{wires}, N_{driven}) = \frac{N_{wires}!}{(N_{wires} - N_{driven})! \cdot N_{driven}!}$$

The equation for the number of combinations of polarity for the wires being driven is:

$$C\left(N_{driven}, \frac{N_{driven}}{2}\right) = \frac{N_{driven}!}{\left(\left(\frac{N_{driven}}{2}\right)!\right)^2}$$

The number of bits per symbol is:

$$\log_2\left(C(N_{wires}, N_{driven}) \cdot C\left(N_{driven}, \frac{N_{driven}}{2}\right) - 1\right)$$

Figure 5:
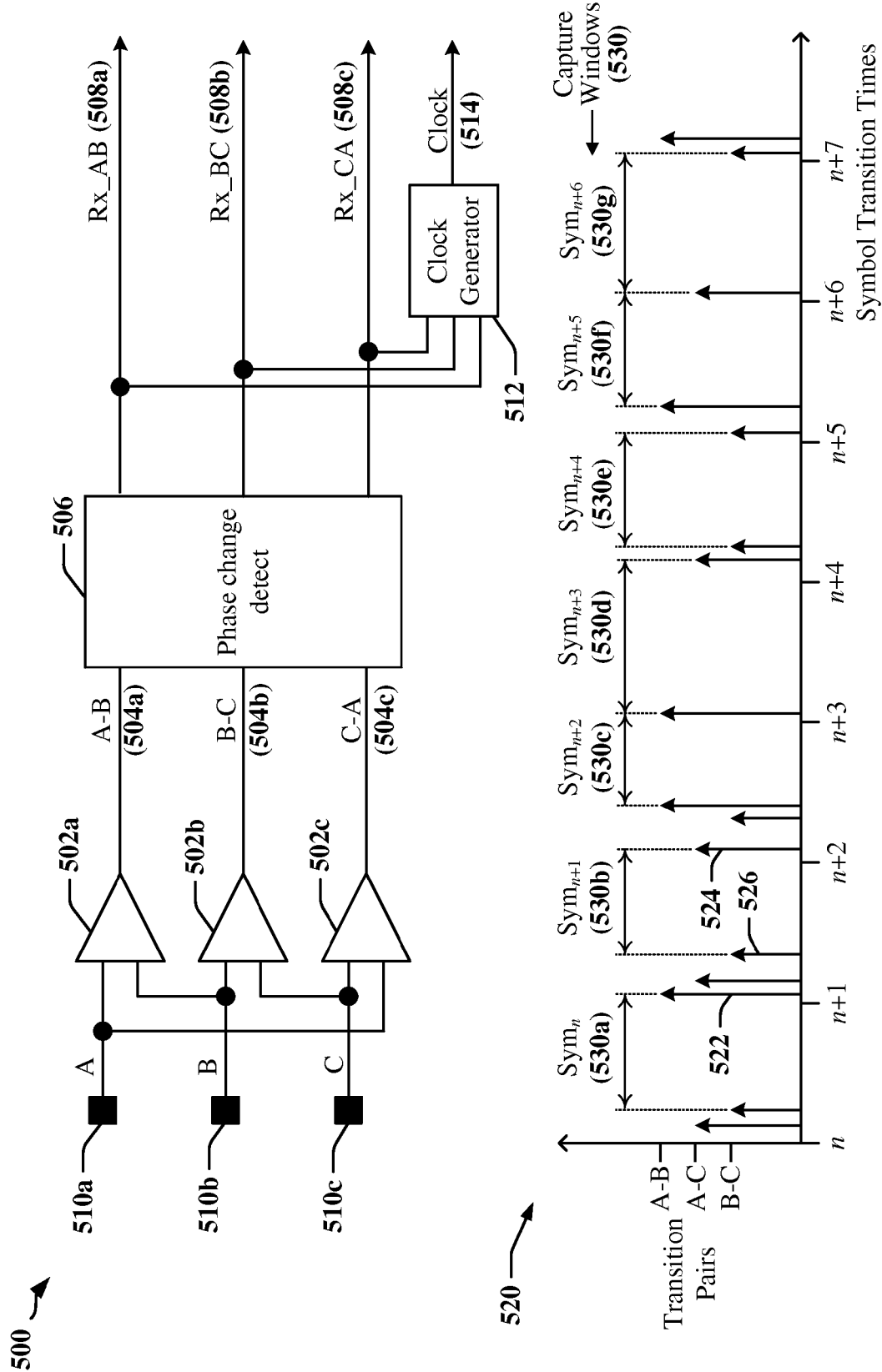
FIG. 5 illustrates transition detection in an M-wire, N-phase polarity decoder.

FIG. 5 includes a block schematic 500 illustrating certain aspects of a receiver in a 3-wire, 3-phase decoder. A set of differential receivers 502a, 502b and 502c is configured to compare each of three wires 510a, 510b and 510c with the other of the three wires 510a, 510b and 510c. In the example depicted, the differential receiver 502a compares the states of wires 510a and 510b and outputs an A–B difference signal 504a, the differential receiver 502b compares the states of wires 510b and 510c and outputs a B–C difference signal 504b, and the differential receiver 502c compares the states of wires 510a and 510c and outputs a C-A difference signal 504c. Accordingly, the phase change detection circuit 506 can be configured to detect occurrence of a phase change because the output 504a, 504b and/or 504c of at least one of the differential receivers 502a, 502b and 502c changes at the end of each phase interval.

Certain phase transitions may be detectable by a single differential receiver 502a, 502b or 502c, while other phase transitions may be detected by two or more of the differential receivers 502a, 502b and 502c. In one example the states, or relative states of two wires may be unchanged after a transition and the output of a corresponding differential receiver 502a, 502b or 502c may also be unchanged after the phase transition. In another example, both wires in a pair of wires 510a, 510b and/or 510c may be in the same state in a first time interval and both wires may be in a same second state in a second time interval and a differential receiver 502a, 502b or 502c that compares the pair of wires may be unchanged after the phase transition. Accordingly, a clock generation circuit may include phase change detect circuits and logic 506 that monitors the outputs of all differential receivers 502a, 502b and 502c in order to determine when a receive (Rx) phase transition has occurred. The clock generation circuit may generate a receive clock 512 signal 514 based on detected phase transitions Rx_AB, Rx_BC and/or Rx_CA output as signals 508a, 508b and 508c, respectively.

Changes in phase states may be detected at different times for different combinations of the wires 510a, 510b and/or 510c. The timing of detection of phase state changes may vary according to the type of phase state change that has occurred. The result of this variability is illustrated in the simplified timing chart 520 of FIG. 5. Markers 522, 524 and 526 representing the outputs of the phase change detection circuits 506 and/or the differential receivers 502a, 502b and 502c are assigned different heights for clarity of illustration only. The relative heights of the markers 522, 524 and 526 have no specific relationship to voltage or current levels, polarity or weighting values used for clock generation or data decoding. The timing chart 520 illustrates the effect of timing of transitions associated with symbols transmitted in phase and polarity on the three wires 510a, 510b and 510c. In the timing chart 520, transitions between some symbols may result in variable capture windows 530a, 530b, 530c, 530d, 530e, 530f and/or 530g (collectively symbol capture windows 530) during which symbols may be reliably captured. The number of state changes detected and their relative timing can result in jitter on the receive clock signal 514.

When simulating a 3-wire, 3-phase communications link, certain analog characteristics of the wires may be modeled to account for variability in symbol windows 530, and jitter that may result from such variability. Variability in the sizes of the symbol windows 530 and jitter may be caused in part by the analog electrical characteristics of the wires 510a, 510b and 510c, as illustrated in the simple example 600 depicted in FIG. 6. More particularly, the analog electrical characteristics of the wires 510a, 510b and 510c that affect rise and fall times may include resistance, capacitance, inductance, voltages and currents provided by line drivers, threshold set at the line receiving circuits, and other factors. Variability in the sizes of the symbol windows 530 may be affected by variability in signal transition times and/or variability in detection circuits caused by manufacturing process tolerances, variations and stability of voltage and current sources and operating temperature.

Figure 6:
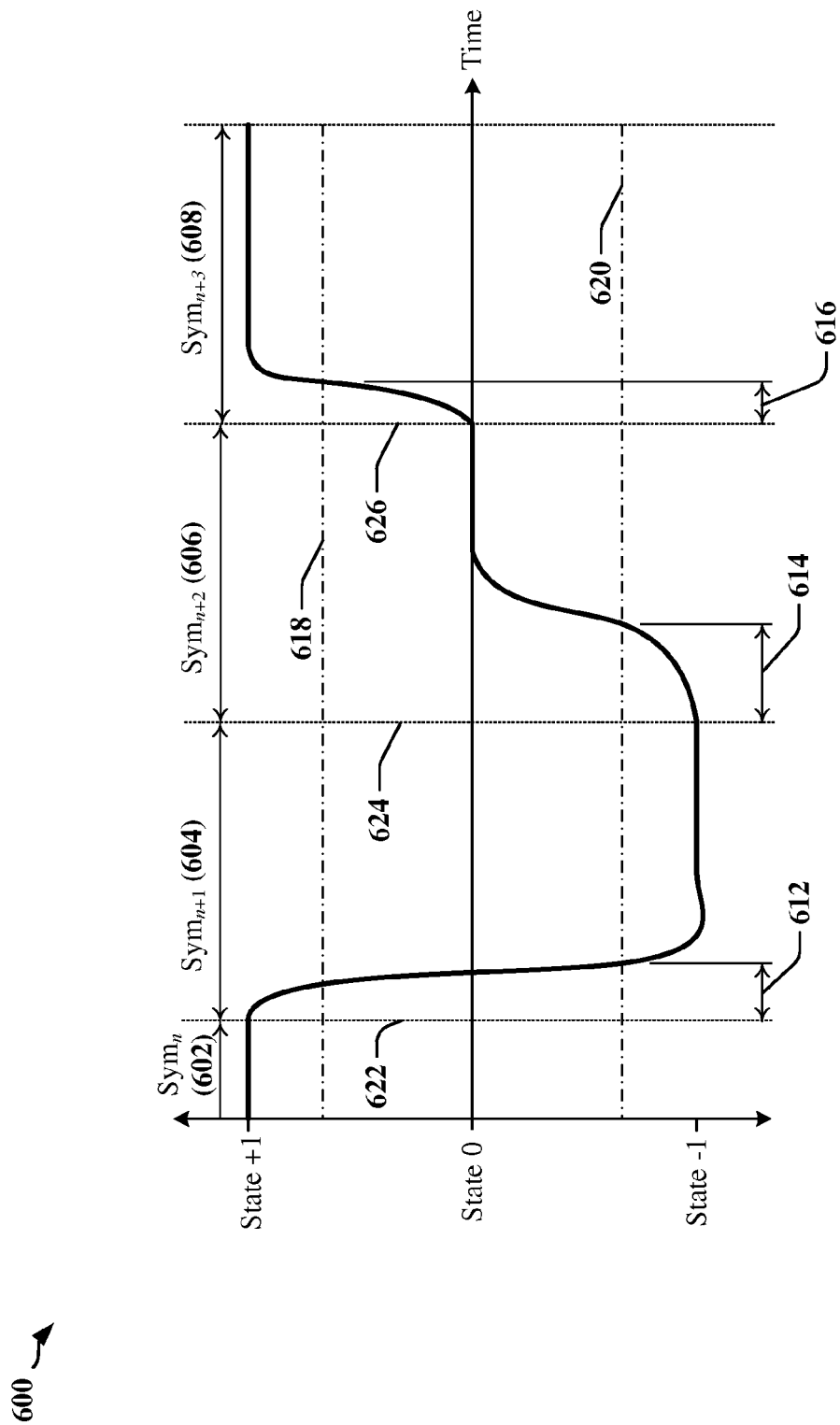
FIG. 6 is a simplified example of the effects of signal rise times on transition detection in an M-wire N-phase polarity decoder.

Large variability in signal transition times can be attributed to the existence of different voltage or current levels in 3-phase signaling. A simplified "voltage-level" example is depicted in FIG. 6, which illustrates transition times in a single wire 510a, 510b or 510c. A first symbol $Sym_n$ interval 602 may end at time 622, a second symbol $Sym_{n+1}$ interval may end at time 624 and a third symbol $Sym_{n+2}$ interval 606 may end at time 626, when a fourth symbol $Sym_{n+3}$ interval 608 begins. The transition from a state determined by a first symbol 602 to the state corresponding to the second symbol 604 may be detected after a delay 612 attributable to the time taken for voltage in the wire 510a, 510b or 510c to reach a threshold voltage 618 and/or 620. The threshold voltages may be used to determine the state of the wire 510a, 510b or 510c. The transition from a state determined by the second symbol 604 to the state for the third symbol 606 may be detected after a delay 614 attributable to the time taken for voltage in the wire 510a, 510b or 510c to reach one of the threshold voltages 618 and/or 620. The transition from a state determined by the third symbol 606 to the state for the fourth symbol 608 may be detected after a delay 616 attributable to the time taken for voltage in the wire 510a, 510b or 510c to reach a threshold voltage 618 and/or 620.

Variable delays 612, 614, 616 may be attributable to the voltage differential between states and whether or not the signal is driven towards a state or pulled toward the state by a pull-up or pull-down resistor, for example.

Figure 7:
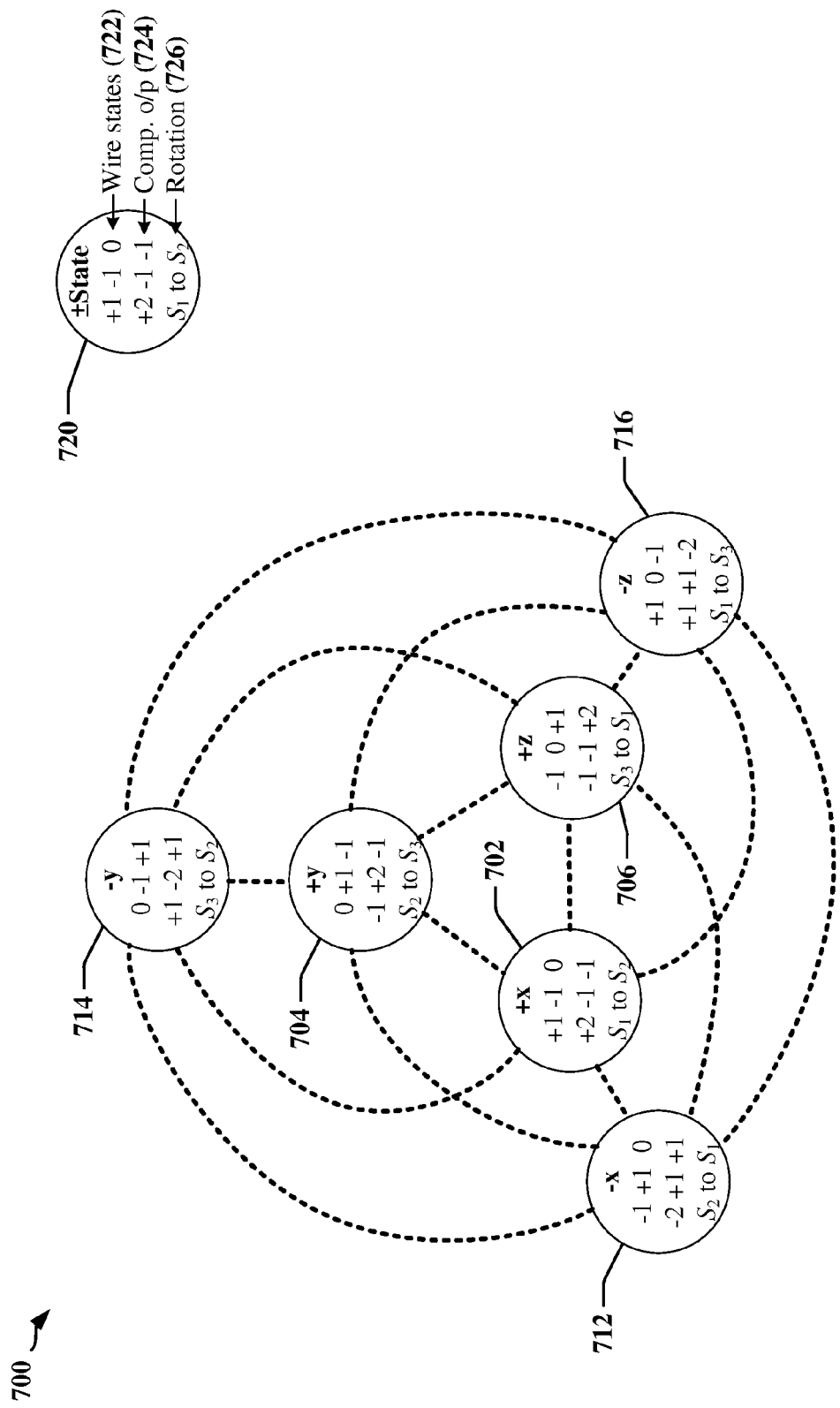
FIG. 7 is a state diagram illustrating potential state transitions in an M-wire, N-phase polarity decoder.

FIG. 7 is a state diagram 700 illustrating 6 states and 30 possible state transitions in one example of a 3-wire, 3-phase communication link. The possible states 702, 704, 706, 712, 714 and 716 in the state diagram 700 include and expand on the states shown in the diagram 450 of FIG. 4. As shown in the exemplar of a state element 720, each state 702, 704, 706, 712, 714 and 716 in the state diagram 700 includes a field 722 showing the voltage state of signals A, B and C (transmitted on wires 610a, 610b and 610c respectively), a field 724 showing the result of a subtraction of wire voltages by differential receivers 502a, 502b, 502c (see FIG. 5), respectively and a field 726 indicating the direction of rotation. For example, in state 702 (+x) wire A=+1, wire B=−1 and wire C=0, yielding output of differential receiver 502a (A−B)=+2, differential receiver 502b (B−C)=−1 and differential receiver 502c (C−A)=+1. The defined states {+1, 0, −1} may be represented on the 510a, 510b and 510c by a voltage set {+V, +V/2, 0} in one example, by a voltage set {+V, 0, −V} in another example, or by some other representation. As illustrated by the state diagram, transition decisions taken by phase change detect circuitry 506 are based on 5 possible levels produced by subtraction by the differential receivers 502a, 502b and 502c, which include −2, −1, 0, +1 and +2 voltage states.

Table 1 illustrates signaling states for a 3-wire 3-phase encoding scheme, where the wires (A, B, C) 510a, 510b and 510c can switch three voltage levels {+V, +V/2, 0}. The difference outputs 504a, 504b or 504c of each of the differential receivers 502a, 502b, 502c represents a difference in input voltages of a pair of the wires 510a, 510b and 510c.

TABLE 1

| Wire State | Wire Amplitude | | | Rx Diff. Input Voltage | | | Rx Digital Output | | |
|---|---|---|---|---|---|---|---|---|---|
| | A | B | C | A − B | B − C | C − A | Rx_AB | Rx_BC | Rx_CA |
| +x | +V | 0 | +V/2 | +V | −V/2 | −V/2 | 1 | 0 | 0 |
| −x | 0 | +V | +V/2 | −V | +V/2 | +V/2 | 0 | 1 | 1 |
| +y | +V/2 | +V | 0 | −V/2 | +V | −V/2 | 0 | 1 | 0 |
| −y | +V/2 | 0 | +V | +V/2 | −V | +V/2 | 1 | 0 | 1 |
| +z | 0 | +V/2 | +V | −V/2 | −V/2 | +V | 0 | 0 | 1 |
| −z | +V | +V/2 | 0 | +V/2 | +V/2 | −V | 1 | 1 | 0 |

Figure 8:
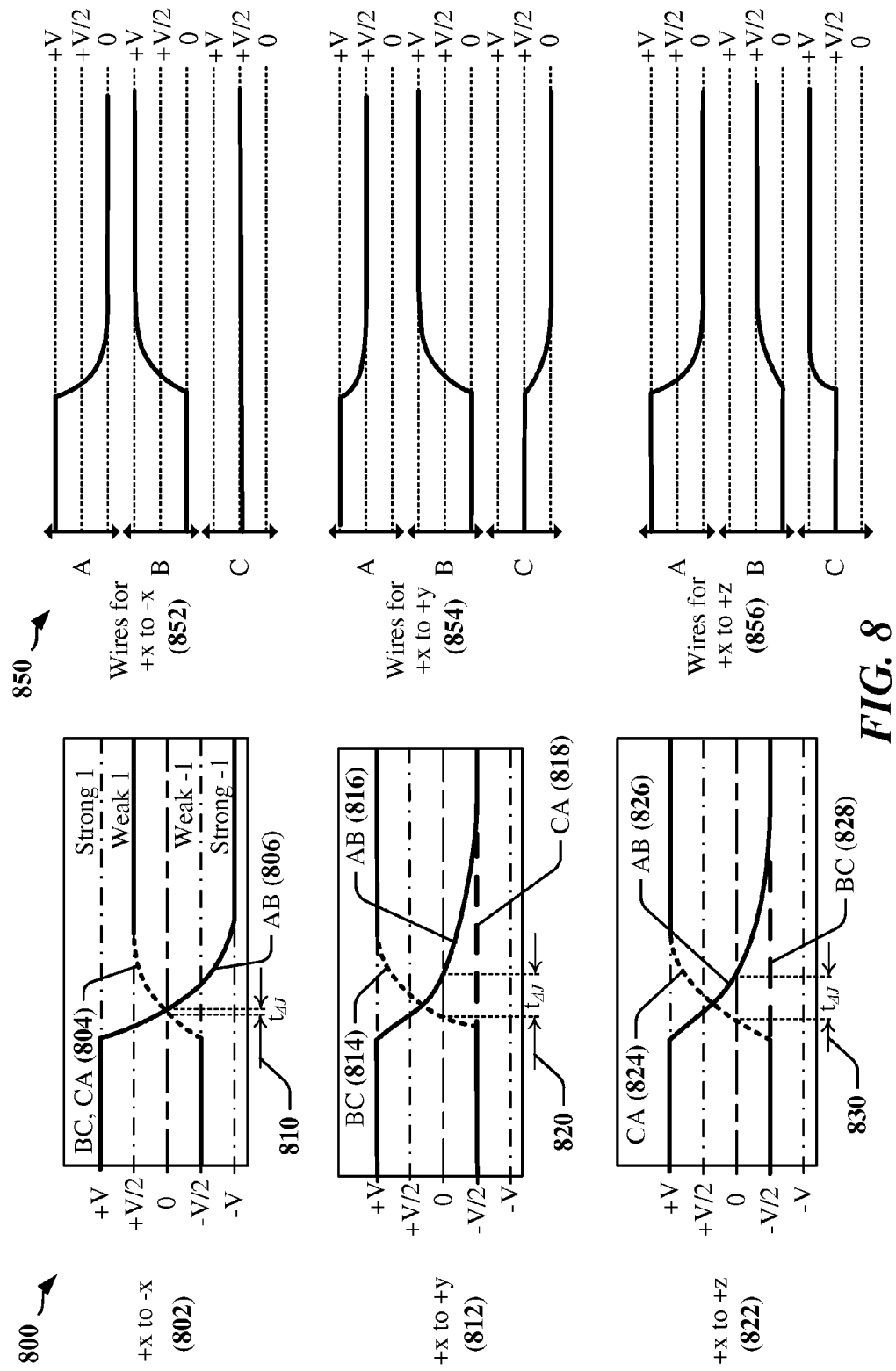
FIG. 8 includes timing charts illustrating variability of symbol transition regions in N-phase polarity encoding when multiple transitions occur between symbols.

FIG. 8 graphically depicts the encoding/decoding scheme of Table 1. The phase change detect circuitry may process the difference outputs 504a, 504b and 504c to produce a binary signal that has a logic '1' value if a difference output 504a, 504b or 504c has a positive voltage and a logic '0' value when the difference output 504a, 504b or 504c has a negative voltage.

FIG. 8 provides timing charts 800 representative of simplified examples of transitions from a first state to a second state and illustrates timing variability attributable to the analog characteristics of the signal wires 504a, 504b and 504c. The timing chart 800 relates to an example of a 3-Wire, 3-Phase communications link, in which multiple receiver output transitions may occur at each unit interval (UI) boundary due to slight differences in rise and fall time between the three signals of the trio of wires and due to slight differences in signal propagation times between the combinations of received signal pairs (e.g. A-B, B-C, and C-A). For the purposes of this description, the signals depicted in FIG. 8 are assumed to have no phase jitter or ISI. The initial state of a wire may be a driven state (0 volts or +V volts), with possible transitions to another driven state or to an undriven state, if the +V/2 volt state is obtained by allowing a wire to float or be passively pulled to the +V/2 volts level. In some instances, all three states may be driven states. The initial state of the wire may be the undriven state, with possible transitions to a driven state.

The timing charts 802, 812 and 822 illustrate the differences between signal wires 510a, 510b and 510c (signals A, B and C, respectively) measurable at the differential receivers 502a, 502b and 502c before and after the signal transitions shown in the set of signal graphs 850. In the examples depicted in FIG. 8, the −1 state is represented by a voltage level of 0 volts, the +1 state is represented by a positive voltage (+V volts), and an intermediate state is defined at +V/2 volts. In many instances, a set of differential receivers 502a, 502b and 502c may be configured to capture transitions by comparing different combinations for two signal wires 510a, 510b and 510c. In one example, these differential receivers 502a, 502b and 502c may be configured to produce outputs by determining the difference (e.g. by subtraction) of their respective input voltages. A clock may be generated based on zero-crossings of the outputs of one or more of the differential receivers 502a, 502b and 502c. A zero-crossing may occur when a signal transitions through a 0 state represented by the voltage at the mid-point in a voltage range between a voltage representing a +1 state and a voltage representing a −1 state. In one example, the zero-crossing occurs at 0 volts when the −1 state is represented by a negative voltage (−V) and the +1 state is represented by a positive voltage (+V).

The timing charts 802 and 852 relate to a transition from symbol (+x) 702 to symbol (−x) 712 (see FIG. 7) in which signal A transitions from a +1 state to a −1 state, signal B transitions from a −1 state to a +1 state and signal C remains at the 0 state. Accordingly, the differential receiver 502a may measure a +2 difference before the AB transition 806 and a −2 difference after the AB transition 806, the differential receivers 502b and 502c may each measure a −1 difference before the BC and CA transitions 804 and a +1 difference after the BC and CA transitions 804. In this example, both the BC and CA transitions 804 and 806 have zero-crossings. The zero-crossings may occur in close temporal proximity 810 because both transitions are towards driven states.

The timing charts 812 and 854 relate to a transition from symbol (+x) 702 to symbol (+y) 704 in which signal A transitions from a +1 state to a 0 state, signal B transitions from a −1 state to a +1 state and signal C transitions from a 0 state to a −1 state. Accordingly, the differential receiver 502a may measure a +2 difference before the AB transition 816 and a −1 difference after the AB transition 816, the differential receiver 502b may measure a −1 difference before the BC transition 814 and a +2 difference after the BC transition 814, and the differential receiver 502c may remain at a −1 difference through the CA "non-transition" 818. In this example, both the BC and AB transitions 814 and 816 have zero-crossings. These zero-crossings may be separated by a significant time interval 820. In one example, the difference may occur because the BC transition 814 involves two signals that have a final driven state while the AB transition 816 relates to one signal that has a final undriven state.

The timing charts 822 and 856 relate to a transition from symbol (+x) 702 to symbol (+z) 706 in which signal A transitions from a +1 state to a −1 state, signal B transitions from a −1 state to a 0 state and signal C transitions from a 0 state to a +1 state. Accordingly, the differential receiver 502a may measure a +2 difference before the AB transition 826 and a −1 difference after the AB transition 826, the differential receiver 602b may measure a −1 difference before and after the BC non-transition 828, and the differential receiver 502c may measure a −1 difference before the CA transition 824 and a +2 difference after the CA transition 824. In this example, the CA and AB transitions 824 and 826 have zero-crossings. These zero-crossings may be separated by a significant period of time 830. In one example, the difference may be attributed to the CA transition 824 involving signals A and C that both have a final driven state while the AB transition 826 involves one signal (the B signal) that has a final undriven state.

The time intervals 810, 820 and 830 between zero-crossings may arise from differences in transition times between different combinations of states. For example, the transition times for transitions to a driven state are shorter than transitions to an undriven state. Other circuit implementations may be employed that produce increased or decreased differences in rise times. For example, the relative time relationship of the signals at the inputs of differential receivers 502a, 502b and 502c may be affected when the zero state is a driven level rather than an undriven level, or where a undriven signal wire is terminated by pull-up and/or pull-down resistors. Thus, different timing relationships can be anticipated for signals received at the receiver inputs.

The examples illustrated in FIG. 8 describe alignment of transitions for the three state transitions +x to −x, +x to +y and +x to +z and, as shown in the timing charts 852, 854 and 856, zero-crossings occur on at least two of the signal wires 510a, 510b and 510c. The conditions that occur in these three state transitions may be present in 18 of the 30 possible state transitions shown in FIG. 7.

According to certain aspects described herein, characteristics of signals and wires carrying the signals in a communication channel may be modeled for simulation purposes. The techniques and methods described herein may be used to model certain analog characteristics of the wires that may affect the operation of a 3-phase communications link. Conventional simulators are limited to modeling specific signals or signal content and cannot accommodate reconfiguration of a link. For example, conventional systems cannot easily simulate communications links that can be reconfigured between 3-phase signaling and binary single-ended or differential signaling to accommodate different power budgets.

According to certain aspects described herein, a connector in the communications link can be modeled without resort to real number modeling of analog characteristics. A signal transmitted over a connector may be represented using a first binary bit to indicate a nominal "active/not-active" condition of the signal transmitted on the connector. Thus, for a binary signal, the first binary bit may be directly mapped to logic '1' and logic '0' states. Additional bits may be used to provide a virtual digital signal that indicates different voltage amplitudes that represent the logic '1' and logic '0' states on the connector, when more than two states are defined for the signal. In the example of a 3-phase signal, an additional pair of bits may be used signify intermediate states such as the +V/2 volts state illustrated in Table 1 and in the signal graphs 850 in FIG. 8. A first bit of the additional pair of bits may indicate that intermediate voltage states are available and the second bit may then select between a maximum state (+V volts) and the intermediate states, which may include a +V/2 volt state.

TABLE 2

| Wire Driving State | Real Amplitude (at One Wire) | Model Wire: Virtual Signal and Digital Signal (at One Wire) | | |
|---|---|---|---|---|
| | | HS_en | HS_mid_level | Bit P |
| HS | 0 | 1 | 0 | 0 |
| HS | +V/2 | | 1 | 1 |
| HS | +V | | 0 | 1 |
| LP | LP Logic 0 (0 volts) | 0 | Don't Care | 0 |
| LP | LP Logic 1 (+V$_{LP}$ volts) | | Don't Care | 1 |
| High-Z | Z | Don't Care | Don't Care | Z |
| Unknown | X | Don't Care | Don't Care | X |

Table 2 illustrates an example of a coding scheme that can be used to simulate multi-phase signals according to certain aspects disclosed herein. The coding scheme can be used to model analog behavior of a connector as well as the behavior of signals transmitted over the connector. Table 2 relates to an application of the coding scheme to model a signal wire 510a, 510b or 510c that may be dynamically reconfigured to conduct a multi-phase signal, a low-power binary signal or another type of signal. The example detailed in Table 2 relates to a signal wire 510a, 510b or 510c that can carry a 3-phase signal, a low-power binary digital signal, or be placed in a high-impedance or "don't care" state.

A digital signal may be encoded in binary primary bit ('P') to represent the physical connection of an analog wire, and a virtual signal may be encoded in HS_mid_level and high-speed enable (HS_en) bits. For example, P may be used to encode an active or inactive signaling states for a simulated signal wire 510a, 510b or 510c. The inactive state may correspond to a zero-volt state, while the active state may include a plurality of voltage states ($V_{signal}$) that have non-zero voltage levels. The simulated signal wire 510a, 510b or 510c may be driven according to different signaling schemes and the voltage level of $V_{signal}$ may be one of plurality of different levels, determined by other bits, including the HS_en and one or more HS_midlevel bits that determine whether a mid-level state is required in high-speed mode, and which of the available mid-level states is selected, respectively.

In one example, when the link is operated as a three-phase link, the virtual signal may include an HS_en bit that is set to logic '1' to indicate high-speed, multi-phase operation, and a single HS_mid_level bit may be employed to indicate when a mid-level voltage is selected. In the example shown in Table 1, HS_mid_level=1 selects $V_{signal}$=+V/2 when the primary bit P=1, and HS_mid_level=0 selects $V_{signal}$=+V when the primary bit P=1. In the three-phase mode of operation, the primary bit set to P=0 selects $V_{signal}$=0 volts. In some instances, other combinations of voltages may be used to provide a 3-phase signal, including a set of voltages {−V, 0, +V}, and the voltages selected by different combinations of primary bit 'P' and the HS_mid_level bits may be interpreted by a simulator accordingly.

In another example, when the link is operated in low power mode, the simulated signal may switch between two binary states. In this mode, HS_en bit may be set to logic '0,' to indicate low-speed binary operation and the HS_mid_level bits may be ignored. Accordingly, the primary bit P selects between the two voltage states that correspond to binary logic states '0' and '1.'

In another example, when the link is placed into high-impedance mode or the state of the connectors is not monitored or otherwise used by circuitry connected to the connector, the state of the primary bit, the HS_en and HS_midlevel bits may be ignored and/or arbitrarily assigned.

According to certain aspects described herein, the set of virtual signals (HS_en and HS_mid_level) associated with each connector in a connection link may be propagated from source to sink during simulation. In a 3-phase application, the digital signal {HS_midlevel, P} may be used to encode three values of the set {0, +V/2, +V}, although other permutations of the virtual signals and voltage levels may be employed.

In some instances, virtual signals may be used to model the behavior of connectors and signals in the receiver circuit illustrated in FIG. 5. For example, each of the outputs 504a, 504b and 504c of the differential line receivers 502a, 502b and 502c may switch between the four voltage levels (−V, −V/2, +V, +V/2) depicted in the graphs 800 of FIG. 8.

Certain behaviors of a multi-phase signal may be modeled by associating different voltage levels or voltage states with a rise time or a rate of rise time to or from the signal state. In one example, and as discussed herein, the voltage level of a signal transitioning toward an undriven voltage state may change more slowly than the voltage level of a signal transitioning toward a driven voltage state. For the purposes of simulation, rise times may be characterized as standard delays and differences may be modeled using parameters that can be applied additively or multiplicatively to the standard delays. In another example, the virtual signal may characterize high-impedance and/or undefined states for physical connections in a communications link as desired to permit simulation of different configurations of the physical connections.

Figure 9:
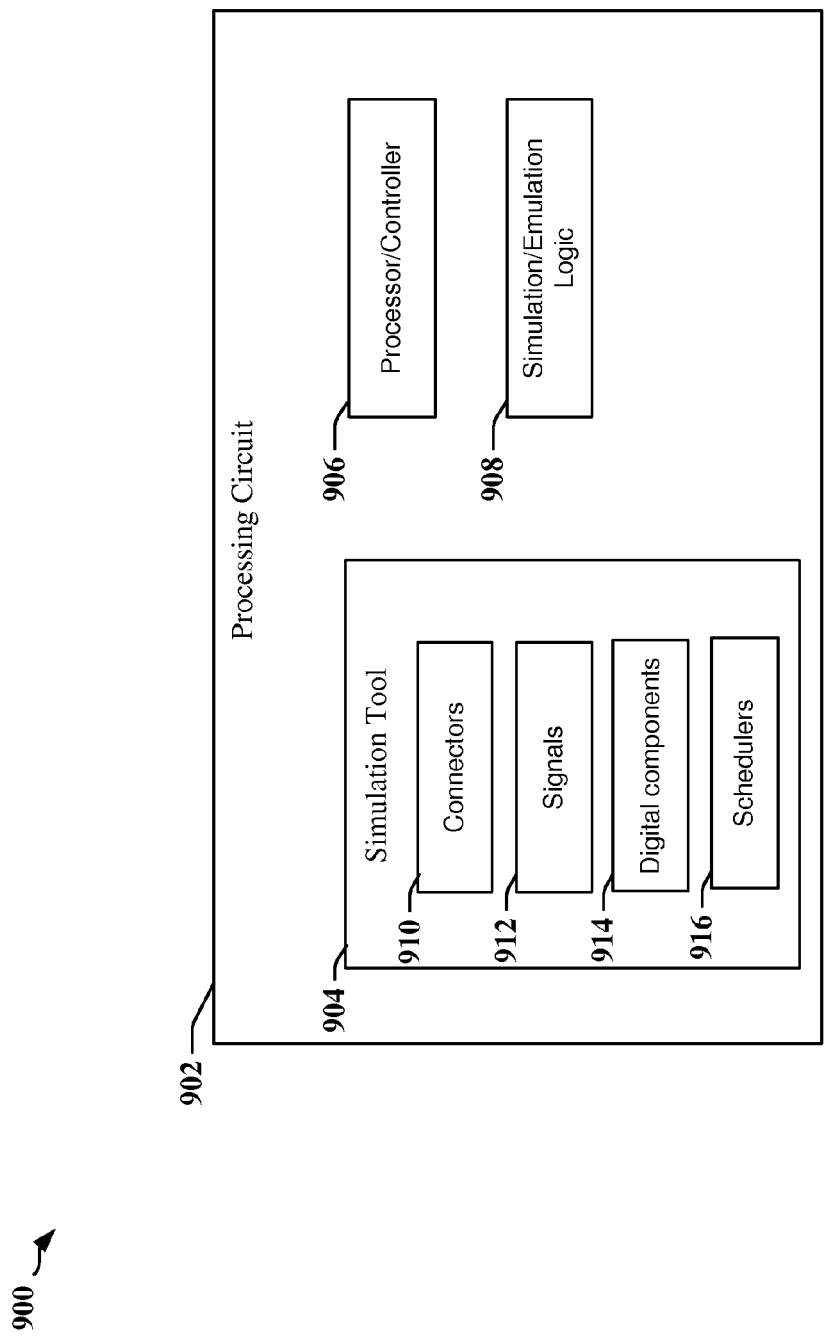
FIG. 9 is a block diagram illustrating a processing circuit configured to model and simulate analog behaviors of connectors in a communications link.

FIG. 9 is a simplified block diagram illustrating an example 900 of a processing circuit or system 902 that can model and simulate analog behaviors of connectors in a communications link. The processing circuit 902 may include a simulation tool 904 that includes software that simulates the behavior of a digital system or digital components 914. A simulation tool 904 may be used to verify hardware before fabrication to verify functionality. A simulation tool 904 according to certain aspects described herein can model the analog behavior of connectors in addition to the signals transmitted over the connectors.

The processing circuit 902 may include various types of hardware and operating systems. In one example, the processing circuit 902 may be adapted from a single-board type of computer, such as a controller or a blade server, a desktop computer, a Windows-based system, a Unix-based system, a Sun Solaris system, a Linux-based system, a distributed system with multiple computing devices, and so on. The simulation tool 904 may be implemented as some combination of hardware and software that cooperates with or executes on one or more processing circuits 902. The simulation tool 904 may include one or more executable programs, libraries and/or sets of data.

The simulation tool 904 may be used to simulate digital systems and/or digital components in addition to communications links. For example, the simulation tool 904 may be used to simulate the digital circuitry in a cellular phone. The simulation tool 904 may model or otherwise represent digital components and/or blocks 914. Digital components 914 may include integrated circuit devices, transistors, digital logic building blocks such as logic gates, etc. The simulation tool 904 may model or otherwise represent one or more connectors 910 of a communications link or interconnect between certain of the digital components 914. The simulation tool 904 may model or otherwise represent one or more signals 912, including signals that are transmitted over connectors 910 of a communications link or interconnect between certain of the digital components 914. The simulation tool 904 may model or otherwise represent other components including one or more clock signals or cycles, passive analog components and so on. The simulation tool 904 may model or otherwise represent one or more schedulers 916 that can be used to simulate clock signals or cycles used by the digital components 914, the signals 912 and/or the connectors 910.

Figure 10:
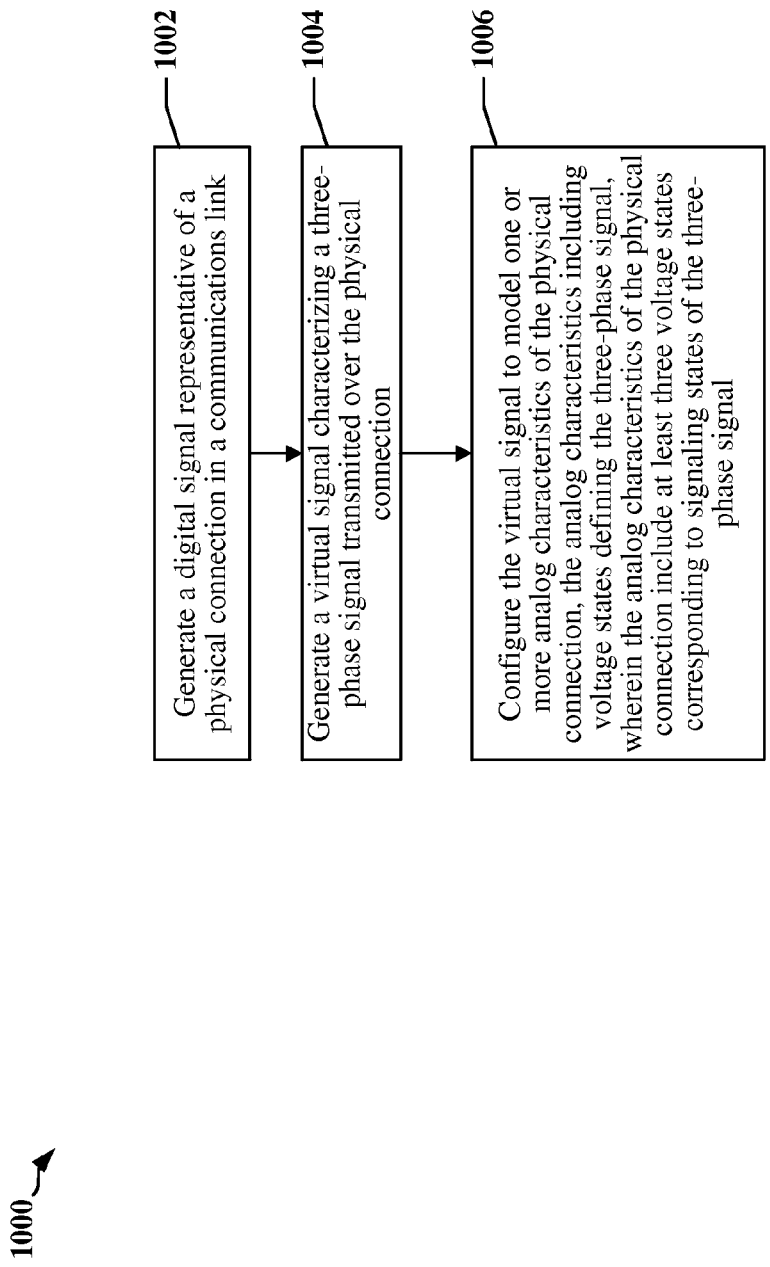
FIG. 10 is a flow chart of a method for simulating digital devices.

FIG. 10 is a flowchart illustrating an encoding method according to certain aspects of the invention. The method may be performed by a simulation tool or a test device.

At step 1002, the device may generate a digital signal representative of a physical connection in a communications link.

At step 1004, the device may generate a virtual signal characterizing a three-phase signal transmitted over the physical connection. In one example, the communications link includes three physical connections, each physical connection communicating a different phase of the three-phase signal when an active mode of operation is selected. Each of the three physical connections may be in the high-impedance state in the inactive mode of operation.

At step 1006, the device may configure the virtual signal to model one or more analog characteristics of the physical connection. The analog characteristics may include voltage states defining the three-phase signal. The analog characteristics of the physical connection may include at least three voltage states corresponding to signaling states of the three-phase signal. The voltage states may include at least three valid voltage states. Each of the voltage state may correspond to a voltage level associated with the physical connection.

According to certain aspects, one of the at least three valid voltage states includes an undriven state. Only one physical connection in the communications link may be validly in the undriven state when the communications link is in an active mode of operation. The virtual signal may select between one or more modes of operation of the physical connection. The physical connection may be in a high-impedance state or an undefined state when an inactive mode of operation is selected. The modes of operation include a high-speed mode and a low-speed mode. The digital signal may include a first binary bit that selects between a first voltage state and a second voltage state. A voltage level of the second voltage state is selected by the virtual signal.

According to certain aspects, the three-phase signal may switch within a voltage range bounded by a maximum voltage level and a minimum voltage level. The first voltage state may be defined as the minimum voltage level. The voltage level of the second voltage state may be selected by the virtual signal as either the maximum voltage level or an intermediate voltage level that is greater than the minimum voltage level and less than the maximum voltage level.

According to certain aspects, the three-phase signal switches within a voltage range bounded by a maximum voltage level and a minimum voltage level. The first voltage state may be defined as the maximum voltage level. The voltage level of the second voltage state may be selected by the virtual signal as either the minimum voltage level or an intermediate voltage level that is greater than the minimum voltage level and less than the maximum voltage level.

According to certain aspects, the virtual signal characterizes analog behaviors of the physical connection when the communications link is operated in a high-speed mode that are different analog behaviors of the physical connection when the communications link is operated in a low-speed modes of operation. The analog behaviors of the physical connection may include a rise time or a rate of rise time between signal states on the physical connection.

Figure 11:
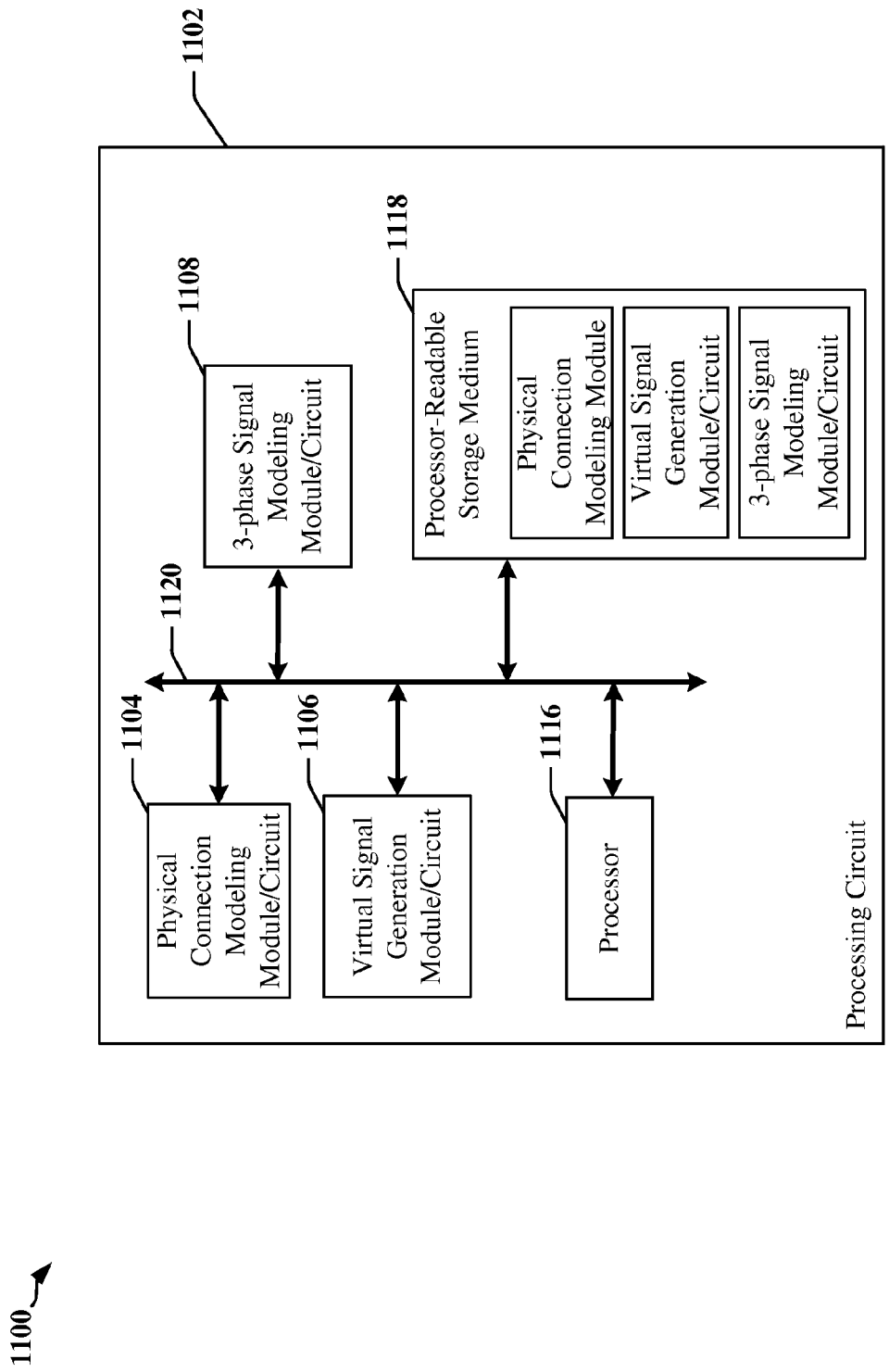
FIG. 11 illustrates one example of an apparatus configured to simulate digital devices according to certain aspects disclosed herein.

FIG. 11 is a diagram illustrating a simplified example of a hardware implementation for an apparatus 1100 employing a processing circuit 1102. The processing circuit 1102 may be implemented with a bus architecture, represented generally by the bus 1120. The bus 1120 may include any number of interconnecting buses and bridges depending on the specific application of the processing circuit 1102 and the overall design constraints. The bus 1120 links together various circuits including one or more processors and/or hardware modules, represented by the processor 1116, the modules or circuits 1104, 1106, 1108, 1112 and the computer-readable storage medium 1118. The bus 1120 may also link various other circuits such as timing sources, peripherals, voltage regulators, and power management circuits, which are well known in the art, and therefore, will not be described any further.

The processor 1116 may include a microprocessor, a controller, a digital signal processor, a sequencer, a state machine, etc. The processor 1116 is responsible for general processing, including the execution of software stored on the computer-readable storage medium 1118. The software, when executed by the processor 1116, causes the processing circuit 1102 to perform the various functions described supra for any particular apparatus. The computer-readable storage medium 1118 may also be used for storing data that is manipulated by the processor 1116 when executing software. The processing circuit 1102 further includes at least one of the modules 1104, 1106 and 1108. The modules 1104, 1106 and/or 1108 may be software modules running in the processor 1116, resident/stored in the computer readable storage medium 1118, one or more hardware modules coupled to the processor 1116, or some combination thereof.

In one configuration, the apparatus 1100 includes modules or circuitry 1104 for generating a digital signal representative of a physical connection in a communications link, modules or circuitry 1106 for generating a virtual signal characterizing a three-phase signal transmitted over the physical connection, modules or circuitry 1108 for configuring the virtual signal to model one or more analog characteristics of the physical connection.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus, comprising:
   at least one processing circuit configured to model a signal transmitted over a physical connection in a communications link, wherein the signal has three phases, is transmitted on each of three wires of the communication link, wherein signaling state of each wire is defined by symbols and each wire is in a different signaling state from the other wires during each symbol interval, and wherein the signal is modeled using:
   a digital signal that represents logic states of the signal transmitted on each wire of the physical connection; and
   a virtual signal that represents one or more analog characteristics of each wire of the physical connection, the analog characteristics including at least three valid voltage states, each voltage state corresponding to a voltage level associated with each wire of the physical connection; wherein the at least one processing circuit is configured to:

characterize the signal transmitted over each wire of the physical connection in each symbol interval using the virtual signal to select between a first voltage amplitude and a second voltage amplitude for the each wire; and verify a digital circuit associated with the signal transmitted over the physical connection using the digital signal and the virtual signal, wherein the digital circuit associated with the signal includes a transmitter that transmits the signal in different phases on the three wires, a receiver that receives different phase versions of the signal from the three wires, or a clock generation circuit in the receiver that extracts clock information from transitions in signaling state of the three wires of the communication link.

2. The apparatus of claim 1, wherein three valid voltage states are defined for the signal.

3. The apparatus of claim 2, wherein one of the at least three valid voltage states includes an undriven state, wherein only one physical connection in the communications link is in the undriven state when the communications link is in an active mode of operation.

4. The apparatus of claim 2, wherein the virtual signal includes a bit that selects between one or more modes of operation of the physical connection.

5. The apparatus of claim 4, wherein each of the three wires communicates a different phase version of a three-phase signal when an active mode of operation is selected, and wherein each of the three wires is in a high-impedance state in an inactive mode of operation.

6. The apparatus of claim 4, wherein the one or more modes of operation include a high-speed mode and a low-speed mode.

7. The apparatus of claim 1, wherein the digital signal comprises a first binary bit that selects between a first voltage state and a second voltage state.

8. The apparatus of claim 7, wherein the second voltage amplitude is a mid-level voltage amplitude.

9. The apparatus of claim 7, wherein:
the signal switches within a voltage range bounded by a maximum voltage amplitude and a minimum voltage amplitude;
the first voltage state is defined as the minimum voltage amplitude; and
the voltage amplitude of the second voltage state is selected by the virtual signal as either the maximum voltage amplitude or an intermediate voltage amplitude that is greater than the minimum voltage amplitude and less than the maximum voltage amplitude.

10. The apparatus of claim 7, wherein:
the signal switches within a voltage range bounded by a maximum voltage amplitude and a minimum voltage amplitude;
the first voltage state is defined as the maximum voltage amplitude; and
the voltage amplitude of the second voltage state is selected by the virtual signal as either the minimum voltage amplitude or an intermediate voltage amplitude that is greater than the minimum voltage amplitude and less than the maximum voltage amplitude.

11. The apparatus of claim 1, wherein the virtual signal characterizes analog behaviors of the physical connection when the communications link is operated in a high-speed mode that are different from analog behaviors of the physical connection when the communications link is operated in a low-speed mode of operation.

12. The apparatus of claim 11, wherein the analog behaviors of the physical connection include a rise time or a rate of rise time between signal states on the physical connection.

13. A method for simulating digital systems, comprising:
modeling a signal transmitted over a physical connection in a communications link, wherein the signal has three phases and is transmitted on each of three wires of the communication link, wherein signaling state of each wire is defined by symbols and each wire is in a different signaling state from the other wires during each symbol interval and wherein modeling the signal includes:

generating a digital signal that represents logic states of the signal transmitted on each wire of the physical connection; and generating a virtual signal that represents one or more analog characteristics on each wire of the physical connection, the analog characteristics including at least three valid voltage states, each voltage state corresponding to a voltage level associated with each wire of the physical connection; and characterizing the signal transmitted over each wire of the physical connection in each symbol interval using the virtual signal to select between a first voltage amplitude and a second voltage amplitude for the each wire; and verifying a digital circuit associated with the signal transmitted over the physical connection using the digital signal and the virtual signal, wherein the digital circuit associated with the signal includes a transmitter that transmits the signal in different phases on the three wires, a receiver that receives different phase versions of the signal from the three wires, or a clock generation circuit in the receiver that extracts clock information from transitions in signaling state of the three wires of the communication link.

14. The method of claim 13, wherein the voltage states include three valid voltage states.

15. The method of claim 14, wherein one of the at least three valid voltage states includes an undriven state, wherein only one physical connection in the communications link is in the undriven state when the communications link is in an active mode of operation.

16. The method of claim 14, wherein the virtual signal includes a bit that selects between one or more modes of operation of the physical connection.

17. The method of claim 16, wherein each of the three wires communicates a different phase of the three phases when an active mode of operation is selected, and wherein each of the three wires is in a high-impedance state in an inactive mode of operation.

18. The method of claim 16, wherein the one or more modes of operation include a high-speed mode and a low-speed mode.

19. The method of claim 13, wherein the digital signal comprises a first binary bit that selects between a first voltage state and a second voltage state.

20. The method of claim 19, wherein the second voltage amplitude is a mid-level voltage amplitude.

21. The method of claim 19, wherein:
the signal switches within a voltage range bounded by a maximum voltage amplitude and a minimum voltage amplitude;
the first voltage state is defined as the minimum voltage amplitude; and the voltage amplitude of the second voltage state is selected by the virtual signal as either the maximum voltage amplitude or an intermediate voltage amplitude that is greater than the minimum voltage amplitude and less than the maximum voltage amplitude.

22. The method of claim 19, wherein:
the signal switches within a voltage range bounded by a maximum voltage amplitude and a minimum voltage amplitude;
the first voltage state is defined as the maximum voltage amplitude; and
the voltage amplitude of the second voltage state is selected by the virtual signal as either the minimum voltage amplitude or an intermediate voltage amplitude that is greater than the minimum voltage amplitude and less than the maximum voltage amplitude.

23. The method of claim 13, wherein the virtual signal characterizes analog behaviors of the physical connection when the communications link is operated in a high-speed mode that are different from analog behaviors of the physical connection when the communications link is operated in a low-speed mode of operation.

24. The method of claim 23, wherein the analog behaviors of the physical connection include a rise time or a rate of rise time between signal states on the physical connection.

25. An apparatus, comprising:
means for modeling a signal transmitted over a physical connection in a communications link, wherein the signal has three phases and is transmitted on each of three wires of the communication link, wherein signaling state of each wire is defined by symbols and each wire is in a different signaling state from the other wires during each symbol interval, and wherein the means for modeling the signal is configured to:
generate a digital signal that represents logic states of the signal transmitted on each wire of the physical connection; and
generate a virtual signal that represents one or more analog characteristics of each wire of the physical connection, the analog characteristics including at least three valid voltage states, each voltage state corresponding to a voltage level associated with each wire of the physical connection;
means for characterizing the signal transmitted over each wire of the physical connection in each symbol interval using the virtual signal to select between a first voltage amplitude and a second voltage amplitude for the each wire; and
means for verifying a digital circuit associated with the signal transmitted over the physical connection using the digital signal and the virtual signal,
wherein the digital circuit associated with the signal includes a transmitter that transmits the signal in different phases on the three wires, a receiver that receives different phase versions of the signal from the three wires, or a clock generation circuit in the receiver that extracts clock information from transitions in signaling state of the three wires of the communication link.

26. The apparatus of claim 25, wherein the voltage states include three valid voltage states.

27. The apparatus of claim 26, wherein one of the at least three valid voltage states includes an undriven state, wherein only one physical connection in the communications link is in the undriven state when the communications link is in an active mode of operation.

28. The apparatus of claim 26, wherein the virtual signal includes a bit that selects between one or more modes of operation of the physical connection.

29. The apparatus of claim 28, wherein each of the three wires communicates a different phase version of a three-phase signal when an active mode of operation is selected, and wherein each of the three wires is in a high-impedance state in an inactive mode of operation.

30. The apparatus of claim 28, wherein the one or more modes of operation include a high-speed mode and a low-speed mode.

31. The apparatus of claim 25, wherein the digital signal comprises a first binary bit that selects between a first voltage state and a second voltage state.

32. The apparatus of claim 31, wherein the second voltage amplitude is a mid-level voltage amplitude.

33. The apparatus of claim 31, wherein:
the signal switches within a voltage range bounded by a maximum voltage amplitude and a minimum voltage amplitude;
the first voltage state is defined as the minimum voltage amplitude; and
the voltage amplitude of the second voltage state is selected by the virtual signal as either the maximum voltage amplitude or an intermediate voltage amplitude that is greater than the minimum voltage amplitude and less than the maximum voltage amplitude.

34. The apparatus of claim 31, wherein:
the signal that has at least three phases switches within a voltage range bounded by a maximum voltage amplitude and a minimum voltage amplitude;
the first voltage state is defined as the maximum voltage amplitude; and
the voltage of the second voltage state is selected by the virtual signal as either the minimum voltage amplitude or an intermediate voltage amplitude that is greater than the minimum voltage amplitude and less than the maximum voltage amplitude.

35. The apparatus of claim 25, wherein the virtual signal characterizes analog behaviors of the physical connection when the communications link is operated in a high-speed mode that are different from analog behaviors of the physical connection when the communications link is operated in a low-speed mode of operation.

36. The apparatus of claim 35, wherein the analog behaviors of the physical connection include a rise time or a rate of rise time between signal states on the physical connection.

37. An apparatus for simulating digital systems, the apparatus comprising:
at least one processing circuit; and
a non-transitory processor-readable storage medium in electronic communication with the processor, wherein the processor-readable storage medium has one or more instructions which, when executed by the at least one processing circuit, causes the at least one processing circuit to:
model a signal transmitted over a physical connection in a communications link, wherein the signal has three phases, is transmitted on each of three wires of the communication link, wherein signaling state of each wire is defined by symbols and each wire is in a different signaling state from the other wires during each symbol interval, and wherein modeling the signal includes: generating a digital signal that represents logic states of the signal transmitted on each wire of the physical connection, and generating a virtual signal that represents one or more analog characteristics of each wire of the physical connection, the analog characteristics including at least three valid voltage states, each voltage state corresponding to a voltage level associated with each wire of the physical connection;

characterizing the signal transmitted over each wire of the physical connection in each symbol interval using the virtual signal to select between a first voltage amplitude and a second voltage amplitude for the each wire; and verify a digital circuit associated with the signal transmitted over the physical connection using the digital signal and the virtual signal, wherein the digital circuit associated with the signal includes a transmitter that transmits the signal in different phases on the three wires, a receiver that receives different phase versions of the signal from the three wires, or a clock generation circuit in the receiver that extracts clock information from transitions in signaling state of the three wires of the communication link.

38. The apparatus of claim 37, wherein the voltage states include three valid voltage states.

39. The apparatus of claim 38, wherein one of the at least three valid voltage states includes an undriven state, wherein only one physical connection in the communications link is in the undriven state when the communications link is in an active mode of operation.

40. The apparatus of claim 38, wherein the virtual signal includes a bit that selects between one or more modes of operation of the physical connection.

41. The apparatus of claim 40, wherein each of the three wires communicates a different phase version of a three-phase signal when an active mode of operation is selected, and wherein each of the three wires is in a high-impedance state in an inactive mode of operation.

42. The apparatus of claim 40, wherein the one or more modes of operation include a high-speed mode and a low-speed mode.

43. The apparatus of claim 37, wherein the digital signal comprises a first binary bit that selects between a first voltage state and a second voltage state.

44. The apparatus of claim 43, wherein the second voltage amplitude is a mid-level voltage amplitude.

45. The apparatus of claim 43, wherein:

the signal that has at least three phases switches within a voltage range bounded by a maximum voltage amplitude and a minimum voltage amplitude;

the first voltage state is defined as the minimum voltage amplitude; and the voltage amplitude of the second voltage state is selected by the virtual signal as either the maximum voltage amplitude or an intermediate voltage amplitude that is greater than the minimum voltage amplitude and less than the maximum voltage amplitude.

46. The apparatus of claim 43, wherein:

the signal switches within a voltage range bounded by a maximum voltage amplitude and a minimum voltage amplitude;

the first voltage state is defined as the maximum voltage amplitude; and the voltage amplitude of the second voltage state is selected by the virtual signal as either the minimum voltage amplitude or an intermediate voltage amplitude that is greater than the minimum voltage amplitude and less than the maximum voltage amplitude.

47. The apparatus of claim 37, wherein the virtual signal characterizes analog behaviors of the physical connection when the communications link is operated in a high-speed mode that are different from analog behaviors of the physical connection when the communications link is operated in a low-speed mode of operation.

48. The apparatus of claim 47, wherein the analog behaviors of the physical connection include a rise time or a rate of rise time between signal states on the physical connection.

\* \* \* \* \*